(12) United States Patent
Chan et al.

(10) Patent No.: US 8,481,394 B2
(45) Date of Patent: Jul. 9, 2013

(54) MEMORY CELL THAT INCLUDES A CARBON-BASED MEMORY ELEMENT AND METHODS OF FORMING THE SAME

(75) Inventors: Michael Y. Chan, Mountain View, CA (US); April D. Schricker, Palo Alto, CA (US)

(73) Assignee: SanDisk 3D LLC, Milpitas, CA (US)

( * ) Notice: Subject to any disclaimer, the term of this patent is extended or adjusted under 35 U.S.C. 154(b) by 232 days.

(21) Appl. No.: 12/717,457

(22) Filed: Mar. 4, 2010

(65) Prior Publication Data

US 2011/0215320 A1 Sep. 8, 2011

(51) Int. Cl.
*H01L 21/20* (2006.01)
(52) U.S. Cl.
USPC .......................................... 438/381; 257/528
(58) Field of Classification Search
USPC .......................................... 438/381; 257/528
See application file for complete search history.

(56) References Cited

U.S. PATENT DOCUMENTS

| | | | |
|---|---|---|---|
| 5,915,167 A | 6/1999 | Leedy | |
| 6,952,030 B2 | 10/2005 | Herner | |
| 7,405,465 B2 | 7/2008 | Herner | |
| 7,504,051 B2 | 3/2009 | Sen et al. | |
| 7,556,746 B2 | 7/2009 | Sen et al. | |
| 7,666,382 B2 | 2/2010 | Ghenciu et al. | |
| 2006/0250836 A1 | 11/2006 | Herner | |
| 2007/0190722 A1 | 8/2007 | Herner | |
| 2008/0165569 A1 | 7/2008 | Chen et al. | |
| 2008/0169531 A1 | 7/2008 | Huo et al. | |
| 2008/0179571 A1 | 7/2008 | Sen et al. | |
| 2008/0248216 A1* | 10/2008 | Yeung et al. | 427/553 |
| 2009/0140213 A1 | 6/2009 | Sen et al. | |
| 2009/0168491 A1 | 7/2009 | Schricker | |
| 2009/0184389 A1 | 7/2009 | Bertin et al. | |
| 2009/0257265 A1 | 10/2009 | Chen et al. | |
| 2009/0278112 A1 | 11/2009 | Schricker | |

FOREIGN PATENT DOCUMENTS

| | | |
|---|---|---|
| WO | WO 2009/114796 | 9/2009 |
| WO | WO 2009/137222 | 11/2009 |
| WO | WO 2010/008938 | 1/2010 |

OTHER PUBLICATIONS

International Search Report and the Written Opinion of International Application No. PCT/US2011/026431 mailed May 26, 2011.
Schricker, U.S. Appl. No. 12/415,011, filed Mar. 31, 2009.
Jayasekara, U.S. Appl. No. 12/408,419, filed Mar. 20, 2009.

* cited by examiner

*Primary Examiner* — Julio J Maldonado
*Assistant Examiner* — Robert Bachner
(74) *Attorney, Agent, or Firm* — Dugan & Dugan, PC

(57) ABSTRACT

In a first aspect, a method of forming a memory cell is provided that includes: (a) forming a layer of dielectric material above a substrate; (b) forming an opening in the dielectric layer; (c) depositing a solution that includes a carbon-based switching material on the substrate; (d) rotating the substrate to cause the solution to flow into the opening and to form a carbon-based switching material layer within the opening; and (e) forming a memory element using the carbon-based switching material layer. Numerous other aspects are provided.

15 Claims, 13 Drawing Sheets

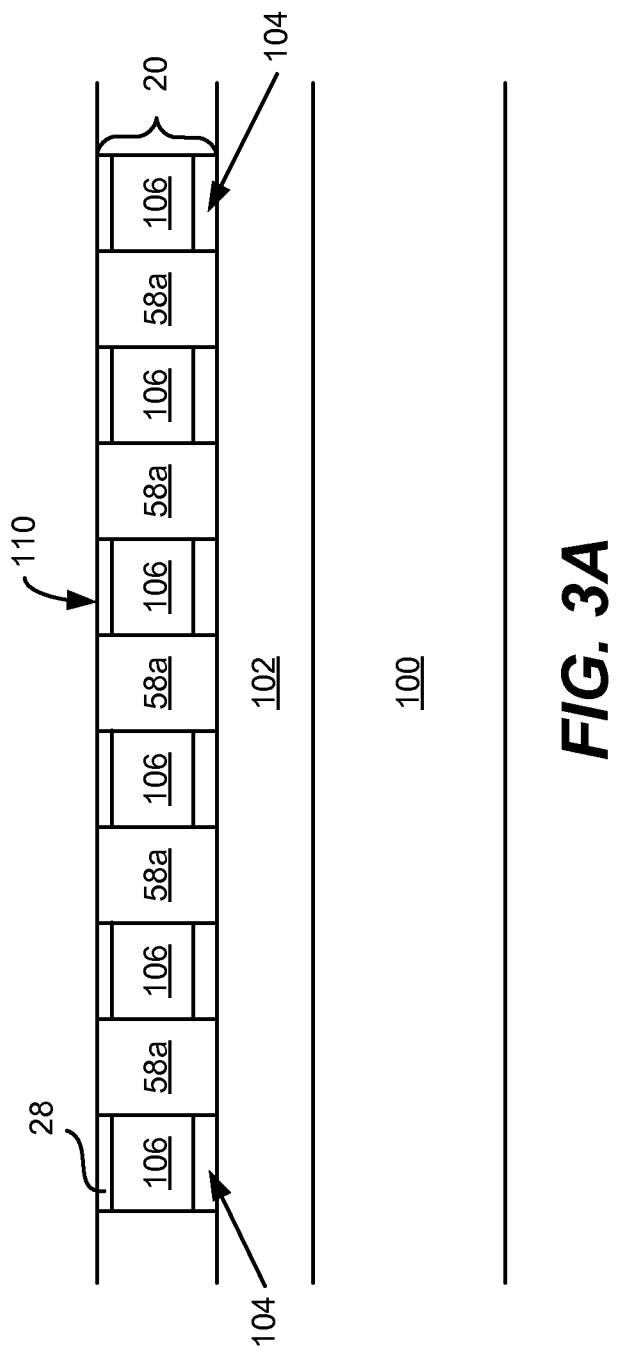

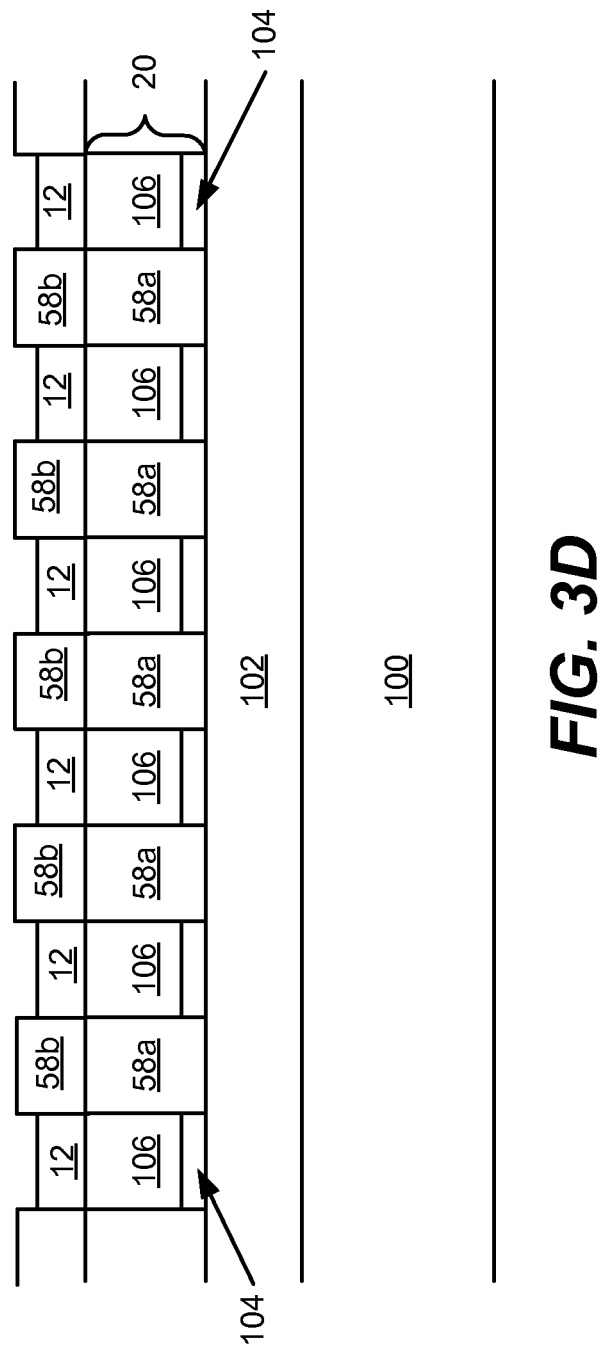

MEMORY CELL THAT INCLUDES A CARBON-BASED MEMORY ELEMENT AND METHODS OF FORMING THE SAME

TECHNICAL FIELD

This invention relates to non-volatile memories, and more particularly to a memory cell that includes a carbon-based memory element, and methods of forming the same.

BACKGROUND

Non-volatile memories formed from reversible resistance-switching elements are known. For example, U.S. patent application Ser. No. 11/968,154, filed Dec. 31, 2007, titled "Memory Cell That Employs A Selectively Fabricated Carbon Nano-Tube Reversible Resistance Switching Element And Methods Of Forming The Same" (the "'154 Application"), which is hereby incorporated by reference herein in its entirety for all purposes, describes a rewriteable non-volatile memory cell that includes a diode coupled in series with a carbon-based reversible resistivity-switching material.

However, fabricating memory devices from carbon-based materials is technically challenging, and improved methods of forming memory devices that employ carbon-based materials are desirable.

SUMMARY

In a first aspect of the invention, a method of forming a memory cell is provided, the method including: (a) forming a layer of dielectric material above a substrate; (b) forming an opening in the dielectric layer; (c) depositing a solution that includes a carbon-based switching material on the substrate; (d) rotating the substrate to cause the solution to flow into the opening and to form a carbon-based switching material layer within the opening; and (e) forming a memory element using the carbon-based switching material layer.

In a second aspect of the invention, a method of forming a memory cell is provided, the method including: (a) forming a layer of dielectric material above a substrate; (b) forming an opening in the dielectric layer; (c) depositing a solution that includes a carbon-based switching material on the substrate; (d) rotating the substrate to cause the solution to flow into the opening and to form a carbon-based switching material layer within the opening; (e) annealing the substrate after step (d) so that the carbon-based switching material remains in the opening; (f) repeating steps (c)-(e) until the carbon-based switching material layer within the opening has a desired thickness; and (g) forming a memory element using the carbon-based switching material layer.

In a third aspect of the invention, a memory cell is provided that includes: (a) a substrate having a first conducting layer formed above the substrate; (b) a dielectric layer having an opening formed above the first conducting layer to expose the first conducting layer; (c) a carbon-based switching layer formed within the opening to fill at least a portion of the opening; (d) a second conducting layer within the opening and formed above the carbon-based switching layer; and (e) a steering element formed above the substrate.

In a fourth aspect of the invention, a memory cell is provided that includes: (a) a first conductor; (b) a dielectric layer formed above the first conductor, the dielectric layer having an opening formed therein; (c) a carbon-based switching layer formed within the opening to fill at least a portion of the opening; (d) a conducting layer within the opening and formed above the carbon-based switching layer; (e) a diode formed above the first conductor; and (f) a second conductor formed above the dielectric layer and the diode. Numerous other aspects are provided.

BRIEF DESCRIPTION OF THE DRAWINGS

Features of the present invention can be more clearly understood from the following detailed description considered in conjunction with the following drawings, in which the same reference numerals denote the same elements throughout, and in which:

FIGS. 3A-3I illustrate cross-sectional views of a portion of a substrate during an exemplary fabrication of a single memory level in accordance with this invention.

DETAILED DESCRIPTION

Figure 1:
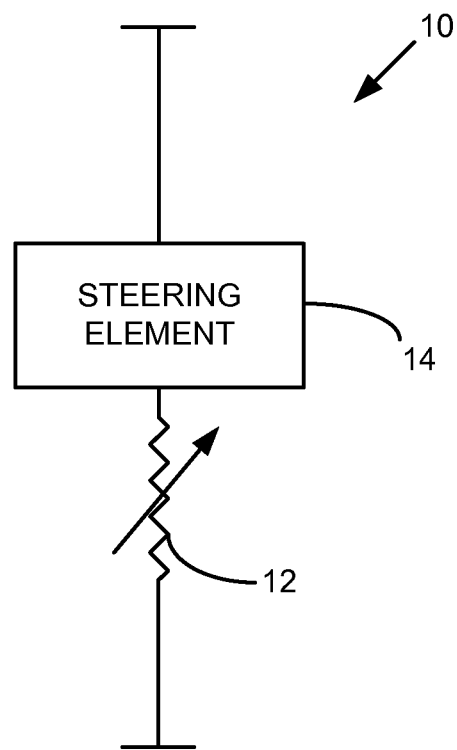
FIG. 1 is a diagram of an exemplary memory cell in accordance with this invention.

Some carbon-based materials have been shown to exhibit reversible resistivity-switching properties that may be suitable for use in non-volatile memories. As used herein, carbon-based read-writeable or "switching" materials generally may include one or more of amorphous carbon containing nanocrystalline graphene (referred to herein as "graphitic carbon"), graphene, graphite, carbon nano-tubes, amorphous diamond-like carbon ("DLC"), silicon carbide, boron carbide and other crystalline forms of carbon, and may also include secondary materials.

Indeed, carbon nano-tube ("CNT") materials have demonstrated memory switching properties on lab-scale devices with a 100× separation between ON and OFF states and mid-to-high range resistance changes. Such a separation between ON and OFF states renders carbon-based materials viable candidates for memory cells in which the carbon-based material is coupled in series with vertical diodes, thin film transistors or other steering elements. For example, a metal-insulator-metal ("MIM") stack formed from a CNT material sandwiched between two metal or otherwise conducting layers may serve as a resistance-switching element for a memory cell. In particular, a CNT MIM stack may be integrated in series with a diode or transistor to create a read-writable memory device as described, for example, in the '154 Application.

Homogeneous CNT materials are known to be porous, so a conventionally-formed CNT-based MIM stack is prone to short-circuiting. In particular, to form a CNT memory circuit using conventional semiconductor processes, physical vapor deposition ("PVD") processing steps are typically used to form the top and bottom electrodes of the memory cell. The high energy levels of PVD-based top electrode metal deposition, however, may cause metal to infiltrate, and possibly penetrate, one or more pores in the CNT material, possibly causing a short with the bottom electrode.

One approach to mitigating the problem of penetration is to deposit a layer of CNT material of sufficient thickness to reduce or eliminate the probability that a short circuit may occur. However, forming a CNT layer of sufficient thickness can be challenging. For example, many commonly used techniques for forming CNT material, such as spin- and spray-coating techniques, typically produce a CNT layer of a limited thickness during a single application, and therefore require multiple applications to form a thicker layer. However, repeated applications of such techniques can be unacceptably time-consuming.

Deposited or grown CNT material typically has a rough surface topography, with pronounced thickness variations, such as numerous peaks and valleys. These thickness variations make CNT materials difficult to etch without excessive etching of the underlying substrate, increasing fabrication costs and complexity associated with their use in integrated circuits. Blanket CNT films also may cause overlay/alignment difficulties between printed layers as the CNT films may be opaque as well as rough.

Another challenge associated with the use of CNT materials in memory devices is the susceptibility of CNT materials (and other carbon-based materials) to being damaged during conventional fabrication processes. For example, exposed carbon-based materials sometimes suffer physical damage from the processes and chemicals commonly used to etch features in memory cells. Exposed carbon-based materials may also suffer damage from certain deposition processes, such as PVD, that are used to form additional layers in a memory cell. Such films also may suffer from adhesion/peeling issues.

In an exemplary embodiment of this invention, the challenges discussed above are mitigated or eliminated by forming a carbon-based switching material, such as CNT material, of a desired thickness using a damascene integration technique. A dielectric layer is formed on a substrate, and the dielectric layer is etched to form one or more openings. A solution containing a selected carbon-based switching material in a liquid is deposited on the substrate using a spin-on technique, for example. Exemplary liquids include water, alcohol, other solvents, etc. While the substrate spins, the carbon-based switching material is forced outward across the substrate and into the opening(s) in the dielectric layer. Capillary action also causes the carbon-based switching material to collect in the opening(s) etched in the dielectric layer. An anneal may be performed to dry the solution, leaving a layer of carbon-based switching material in each opening. The above procedure may be repeated until a desired thickness of carbon-based switching material is formed in each opening.

Notably, in this exemplary embodiment, the carbon-based switching material is not subjected to an etch step during fabrication. In addition, entrapping the carbon-based switching material in openings conserves carbon-based switching material that would otherwise be spun off of the substrate. Further, because the carbon-based switching material is formed within an opening surrounded by dielectric, peeling/adhesion issues are reduced and/or eliminated and compatibility is improved. Likewise, blanket layers are not employed. As such, the carbon-based switching material is formed only where needed, requires no etching and does not affect alignment/overlay. Carbon-based switching films may be formed of sufficient thickness to resist electrode penetration/shorting, with a thickness defined by the height of opening(s) formed in the dielectric layer.

These and other advantages of the invention are described below with reference to FIGS. 1-3I. Although described primarily with respect to CNT films, it will be understood that other carbon-based switching materials may be formed using similar processes.

Exemplary Inventive Memory Cell

FIG. 1 is a schematic illustration of an exemplary memory cell 10 in accordance with this invention. Memory cell 10 includes a reversible resistance-switching element 12 coupled to a steering element 14. Reversible resistance-switching element 12 includes a reversible resistivity-switching material (not separately shown) having a resistivity that may be reversibly switched between two or more states.

For example, the reversible resistivity-switching material of element 12 may be in an initial, low-resistivity state upon fabrication. Upon application of a first voltage and/or current, the material is switchable to a high-resistivity state. Application of a second voltage and/or current may return the reversible resistivity-switching material to a low-resistivity state. Alternatively, reversible resistance-switching element 12 may be in an initial, high-resistance state upon fabrication that is reversibly switchable to a low-resistance state upon application of the appropriate voltage(s) and/or current(s). When used in a memory cell, one resistance state may represent a binary "0," whereas another resistance state may represent a binary "1," although more than two data/resistance states may be used.

Numerous reversible resistivity-switching materials and operation of memory cells employing reversible resistance-switching elements are described, for example, in U.S. patent application Ser. No. 11/125,939, filed May 9, 2005 and titled "Rewriteable Memory Cell Comprising A Diode And A Resistance Switching Material" (the "'939 Application"), which is hereby incorporated by reference herein in its entirety for all purposes.

Steering element 14 may include a thin film transistor, a diode, a metal-insulator-metal tunneling current device, or another similar steering element that exhibits non-ohmic conduction by selectively limiting the voltage across and/or the current flow through reversible resistance-switching element 12. In this manner, memory cell 10 may be used as part of a two or three dimensional memory array and data may be written to and/or read from memory cell 10 without affecting the state of other memory cells in the array.

Exemplary embodiments of memory cell 10, reversible resistance-switching element 12 and steering element 14 are described below with reference to FIGS. 2A-2D.

Exemplary Embodiments of Memory Cells and Memory Arrays

Figure 2A:
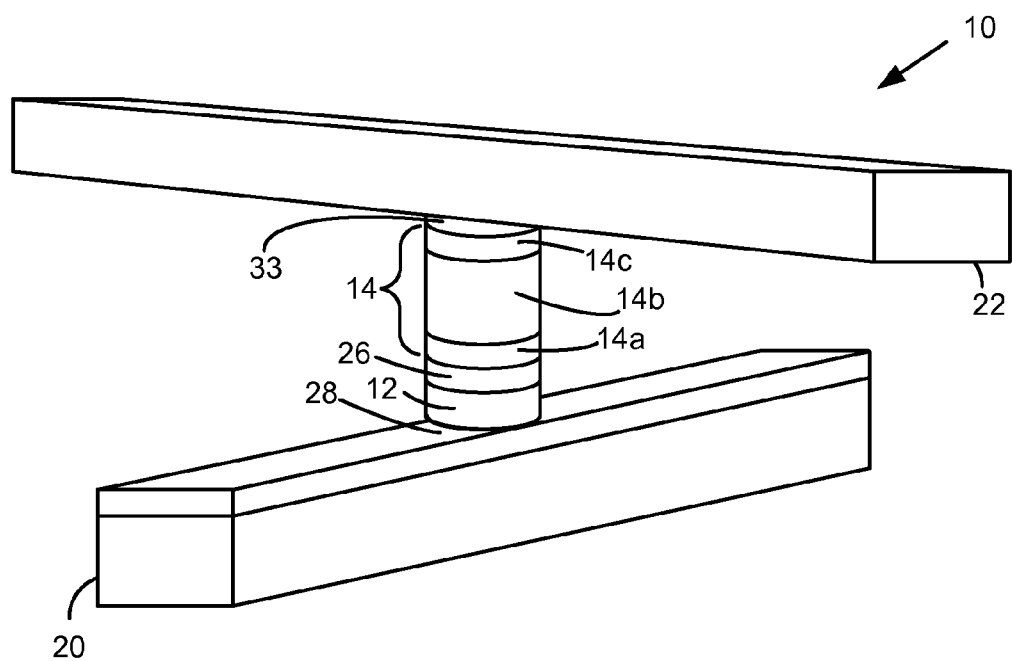
FIG. 2A is a simplified perspective view of an exemplary memory cell in accordance with this invention.

FIG. 2A is a simplified perspective view of an exemplary embodiment of a memory cell 10 in accordance with this invention. Memory cell 10 includes a carbon-based reversible resistivity-switching material 12 ("C-based switching material 12") coupled in series with a steering element 14 between a first conductor 20 and a second conductor 22. In some embodiments, C-based switching material 12 may be positioned above steering element 14. In some embodiments, steering element 14 may be omitted, and memory cell 10 may be used with a remotely located steering element.

Barrier layer 26 may be formed between C-based switching material 12 and steering element 14, barrier layer 28 may be formed between C-based switching material 12 and first conductor 20, and barrier layer 33 may be formed between steering element 14 and second conductor 22. Barrier layers 26, 28 and 33 may include titanium nitride, tantalum nitride, tungsten, tungsten nitride, molybdenum, or other similar barrier layer material. In some embodiments, barrier layer 28 may be formed as part of lower conductor 20 and barrier layer 33 may be formed as part of upper conductor 22.

In exemplary embodiments of this invention, C-based switching material 12 may include CNT material ("CNT layer 12"). In other embodiments, other C-based switching materials may be used, including graphitic carbon, graphene, graphite, DLC, silicon carbide, boron carbide and other crystalline forms of carbon graphene.

CNT layer 12 may include single wall tubes, double wall tubes, multi-wall tubes, shortened CNTs such as buckeyballs, combinations of the same or any other CNT form. CNT layer 12 may include CNT material and also filler material such as amorphous carbon, other carbon materials or dielectric filler material in any suitable ratio. Use of a dielectric filler material may reduce the overall thermal resistance of a resistivity-switchable layer, as compared to use of a non-dielectric filler material, such as a carbon-based filler material. Reducing the thermal resistance may reduce the temperature change experienced by a switching layer when the layer switches resistivities. Thus, use of a dielectric filler material may reduce the temperature change experienced when the layer switches resistivities, as compared to using a non-dielectric filler material.

Furthermore, dielectric filler material may disperse into and seal topside pores of a diluted CNT film, helping to impede penetration of top electrode metal into the sealed pores. Similarly, dilution of the CNT material in a dispersion of dielectric filler material may reduce and/or prevent damage to the CNT material during top electrode deposition, in some embodiments, by shielding the CNT material from full exposure to the metal deposition process. In some embodiments, for instance, CNT material may be mixed with dielectric filler material, such as silicon nitride and silicon oxide nanoparticles (e.g., up to about 5% silicon nitride nanoparticles).

Examples of carbon-based films formed from mixtures of CNT material and various dielectric filler materials, and properties thereof, are described in U.S. patent application Ser. No. 12/415,011, filed Mar. 31, 2009, titled "Carbon-Based Films, And Methods Of Forming The Same, Having Dielectric Filler Material And Exhibiting Reduced Thermal Resistance," which is hereby incorporated by reference herein in its entirety for all purposes.

The nature of CNT material may be characterized by its ratio of forms of carbon-carbon bonding. Carbon typically bonds to carbon to form either an $sp^2$-bond (a trigonal double C=C bond) or an $sp^3$-bond (a tetrahedral single C—C bond). In each case, a ratio of $sp^2$-bonds to $sp^3$-bonds can be determined via Raman spectroscopy by evaluating the D and G bands. In some embodiments, the range of materials may include those having a ratio such as $M_y N_z$ where M is the $sp^3$ material and N is the $sp^2$ material and y and z are any fractional value from zero to 1 as long as y+z=1.

Although spin-on techniques are used in exemplary embodiments described herein, other methods may be used to deposit CNT material. For example, in other embodiments, CNT material deposition methods may include spray-on and other similar deposition techniques.

In some embodiments, a resistivity of C-based switching material 12 may be at least $1 \times 10^1$ ohm-cm when C-based switching material 12 is in an ON-state, whereas a resistivity of C-based switching material 12 may be at least $1 \times 10^3$ ohm-cm when C-based switching material 12 is in an OFF-state. Other resistivity values may be used.

In an exemplary embodiment of this invention, steering element 14 includes a diode. In this discussion, steering element 14 is sometimes referred to as "diode 14." Diode 14 may include any suitable diode such as a vertical polycrystalline p-n or p-i-n diode, whether upward pointing with an n-region above a p-region of the diode or downward pointing with a p-region above an n-region of the diode. For example, diode 14 may include a heavily doped n+ polysilicon region 14a, a lightly doped or an intrinsic (unintentionally doped) polysilicon region 14b above n+ polysilicon region 14a, and a heavily doped p+ polysilicon region 14c above intrinsic region 14b. It will be understood that the locations of the n+ and p+ regions may be reversed.

First conductor 20 and/or second conductor 22 may include any suitable conductive material such as tungsten, any appropriate metal, heavily doped semiconductor material, a conductive silicide, a conductive silicide-germanide, a conductive germanide, or the like. In the embodiment of FIG. 2A, first and second conductors 20 and 22, respectively, are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with first conductor 20 and/or second conductor 22 to improve device performance and/or aid in device fabrication.

Figure 2B:
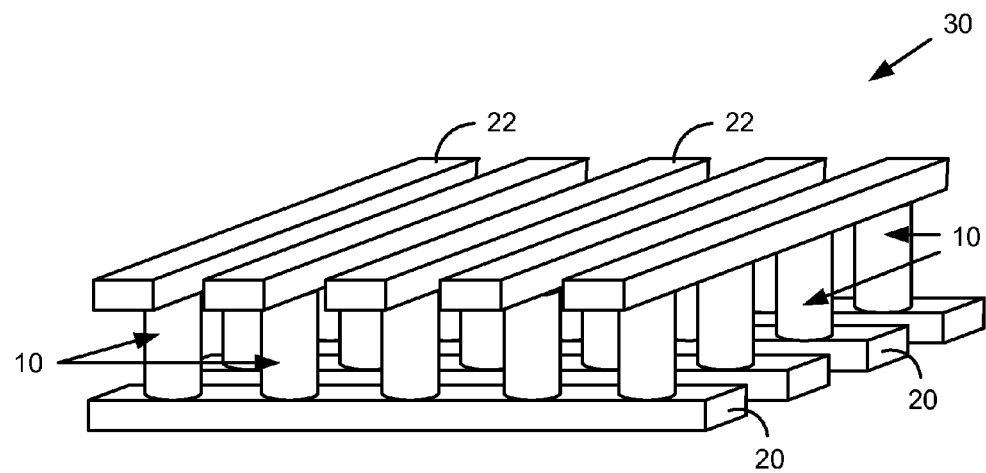
FIG. 2B is a simplified perspective view of a portion of a first exemplary memory level formed from a plurality of the memory cells of FIG. 2A.

FIG. 2B is a simplified perspective view of a portion of a first memory level 30 formed from a plurality of memory cells 10, such as memory cells 10 of FIG. 2A. For simplicity, C-based switching material 12, diode 14, and barrier layers 26, 28 and 33 are not separately shown. Memory level 30 is a "cross-point" array including a plurality of bit lines (second conductors 22) and word lines (first conductors 20) to which multiple memory cells are coupled (as shown). Other memory array configurations may be used, as may multiple levels of memory.

Figure 2C:
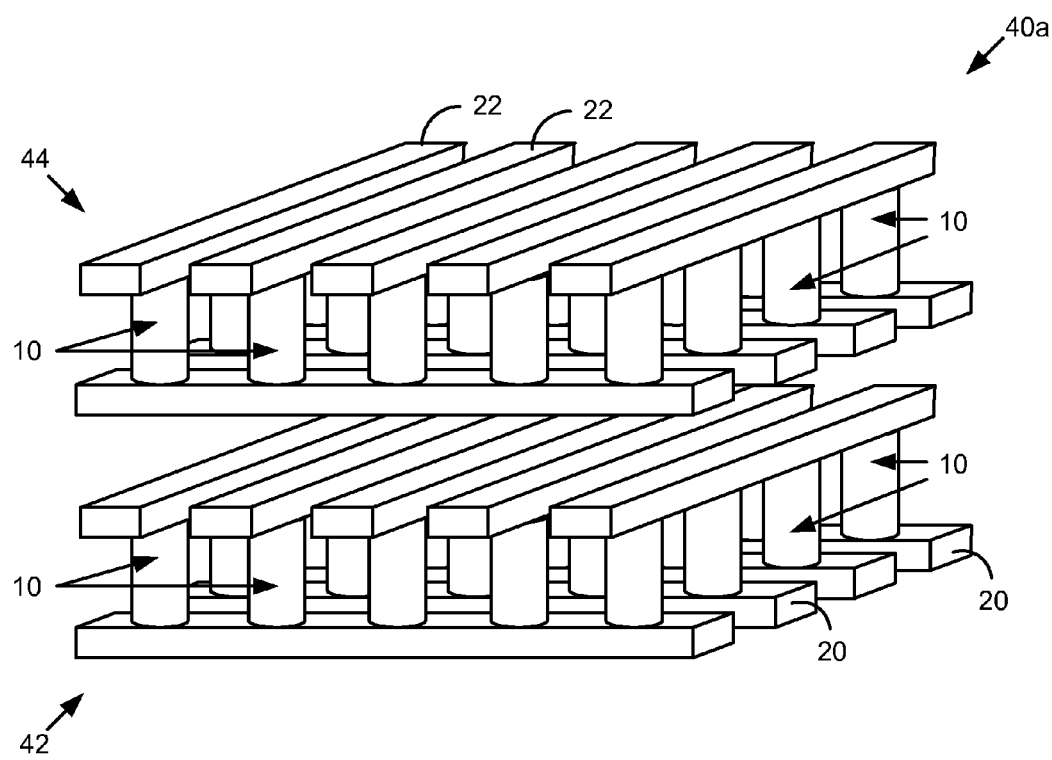
FIG. 2C is a simplified perspective view of a portion of a first exemplary three-dimensional memory array in accordance with this invention.

For example, FIG. 2C is a simplified perspective view of a portion of a monolithic three dimensional memory array 40a that includes a first memory level 42 positioned below a second memory level 44. Memory levels 42 and 44 each include a plurality of memory cells 10 in a cross-point array. Persons of ordinary skill in the art will understand that additional layers (e.g., an interlevel dielectric) may be present between first and second memory levels 42 and 44, but are not shown in FIG. 2C for simplicity. Other memory array configurations may be used, as may additional levels of memory. In the embodiment of FIG. 2C, all diodes may "point" in the same direction, such as upward or downward depending on whether p-i-n diodes having a p-doped region on the bottom or top of the diodes are employed, simplifying diode fabrication.

Figure 2D:
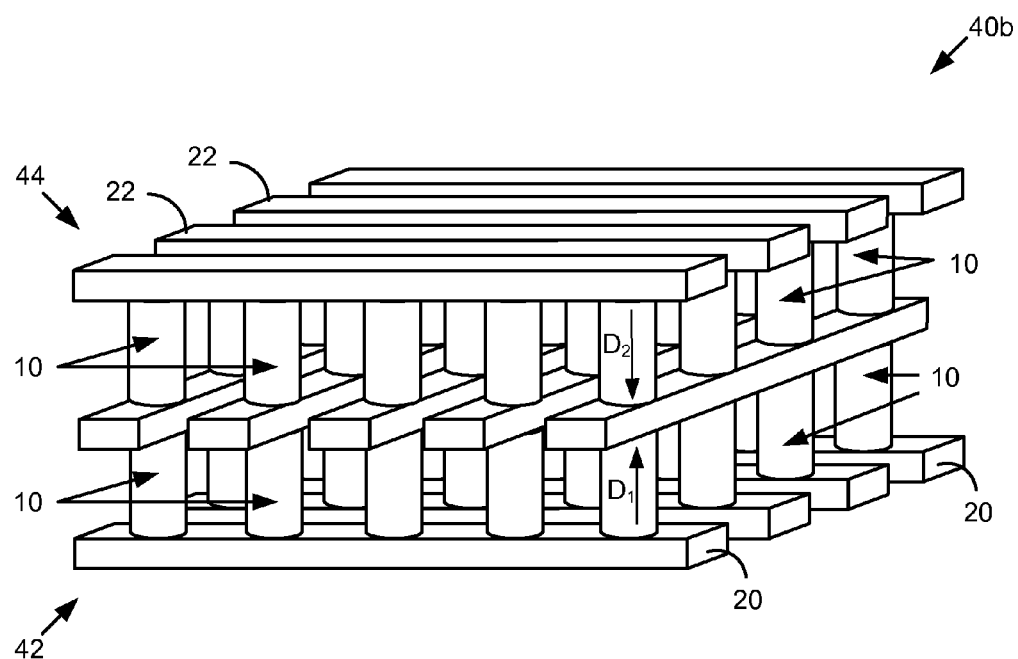
FIG. 2D is a simplified perspective view of a portion of a second exemplary three-dimensional memory array in accordance with this invention.

In some embodiments, the memory levels may be formed as described in U.S. Pat. No. 6,952,030, titled "High-Density Three-Dimensional Memory Cell," which is hereby incorporated by reference herein in its entirety for all purposes. For instance, the upper conductors of a first memory level may be used as the lower conductors of a second memory level that is positioned above the first memory level as shown in FIG. 2D. In such embodiments, the diodes on adjacent memory levels preferably point in opposite directions as described in U.S. patent application Ser. No. 11/692,151, filed Mar. 27, 2007 and titled "Large Array Of Upward Pointing P-I-N Diodes Having Large And Uniform Current" (the "'151 Application"), which is hereby incorporated by reference herein in its entirety for all purposes.

For example, as shown in FIG. 2D, the diodes of the first memory level 42 may be upward pointing diodes as indicated by arrow D1 (e.g., with p regions at the bottom of the diodes), whereas the diodes of the second memory level 44 may be downward pointing diodes as indicated by arrow D2 (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

As discussed above, CNT films are known to be porous, and a conventionally-formed CNT-based MIM stack is prone to short-circuiting. In addition, blanket CNT layers (and other carbon-based materials) may peel, are difficult to etch, may cause lithography/overlay issues and may be damaged during conventional fabrication processes. Improved methods and apparatus for forming memory cells that include CNT material are desirable.

Accordingly, in an exemplary embodiment of this invention, CNT layer 12 is formed using a damascene integration technique. In particular, a damascene integration technique may be used to fabricate an array of CNT-based memory cells on a substrate.

Exemplary Fabrication Processes for Memory Cells

Referring now to FIGS. 3A-3I, a first exemplary method of forming an exemplary memory level in accordance with this invention is described. In particular, FIGS. 3A-I illustrate an exemplary method of forming a memory level including memory cells 10 of FIG. 2A. As will be described below, the first memory level includes a plurality of memory cells that each include a steering element and a CNT-based reversible resistance-switching element coupled to the steering element. Additional memory levels may be fabricated above the first memory level (as described previously with reference to FIGS. 2C-2D).

With reference to FIG. 3A, substrate 100 is shown as having already undergone several processing steps. Substrate 100 may be any suitable substrate such as a silicon, germanium, silicon-germanium, undoped, doped, bulk, silicon-on-insulator ("SOI") or other substrate with or without additional circuitry. For example, substrate 100 may include one or more n-well or p-well regions (not shown).

Isolation layer 102 is formed above substrate 100. In some embodiments, isolation layer 102 may be a layer of silicon dioxide, silicon nitride, silicon oxynitride or any other similar insulating layer.

Following formation of isolation layer 102, an adhesion layer 104 is formed over isolation layer 102 (e.g., by physical vapor deposition or other suitable method). For example, adhesion layer 104 may be about 20 to about 500 angstroms, and preferably about 100 angstroms, of titanium nitride or another suitable adhesion layer such as tantalum nitride, tungsten, tungsten nitride, molybdenum, combinations of one or more adhesion layers, or the like. Other adhesion layer materials and/or thicknesses may be employed. In some embodiments, adhesion layer 104 may be optional.

After formation of adhesion layer 104, a conductive layer 106 is deposited over adhesion layer 104. Conductive layer 106 may include any suitable conductive material such as tungsten or another appropriate metal, heavily doped semiconductor material, a conductive silicide, a conductive silicide-germanide, a conductive germanide, or the like deposited by any suitable method (e.g., chemical vapor deposition ("CVD"), PVD, etc.). In at least one embodiment, conductive layer 106 may comprise about 200 to about 2500 angstroms of tungsten. Other conductive layer materials and/or thicknesses may be used.

In some embodiments, a barrier layer 28 may be formed over conductive layer 106. For example, barrier layer 28 may be about 20 to about 500 angstroms, and preferably about 100 angstroms, of titanium nitride or another suitable barrier layer such as tantalum nitride, tungsten, tungsten nitride, molybdenum, combinations of one or more barrier layers, barrier layers in combination with other layers such as titanium/titanium nitride, tantalum/tantalum nitride or tungsten/tungsten nitride stacks, or the like.

Following formation of conductive layer 106, adhesion layer 104 and conductive layer 106 are patterned and etched. Barrier layer 28 also may be patterned and etched if present. For example, adhesion layer 104, conductive layer 106 and barrier layer 28 may be patterned and etched using conventional lithography techniques, with a soft or hard mask, and wet or dry etch processing. In at least one embodiment, adhesion layer 104, conductive layer 106 and barrier layer 28 are patterned and etched to form substantially parallel, substantially co-planar first conductors 20. Exemplary widths for first conductors 20 and/or spacings between first conductors 20 range from about 200 to about 2500 angstroms, although other conductor widths and/or spacings may be used.

After first conductors 20 have been formed, a dielectric layer 58a is formed over substrate 100 to fill the voids between first conductors 20. For example, approximately 3000-7000 angstroms of silicon dioxide may be deposited on substrate 100 and planarized using chemical mechanical polishing or an etchback process to form a planar surface 110. Planar surface 110 includes exposed top surfaces of first conductors 20 separated by dielectric material (as shown). Other dielectric materials such as silicon nitride, silicon oxynitride, low k dielectrics, etc., and/or other dielectric layer thicknesses may be used. Exemplary low k dielectrics include carbon doped oxides, silicon carbon layers, or the like.

In other embodiments of the invention, first conductors 20 may be formed using a damascene process in which dielectric layer 58a is formed, patterned and etched to create openings or voids for first conductors 20. The openings or voids then may be filled with adhesion layer 104 and conductive layer 106 (and/or a conductive seed, conductive fill and/or barrier layer if needed). Adhesion layer 104 and conductive layer 106 then may be planarized to form planar surface 110. In such an embodiment, adhesion layer 104 will line the bottom and sidewalls of each opening or void.

Figure 3B:
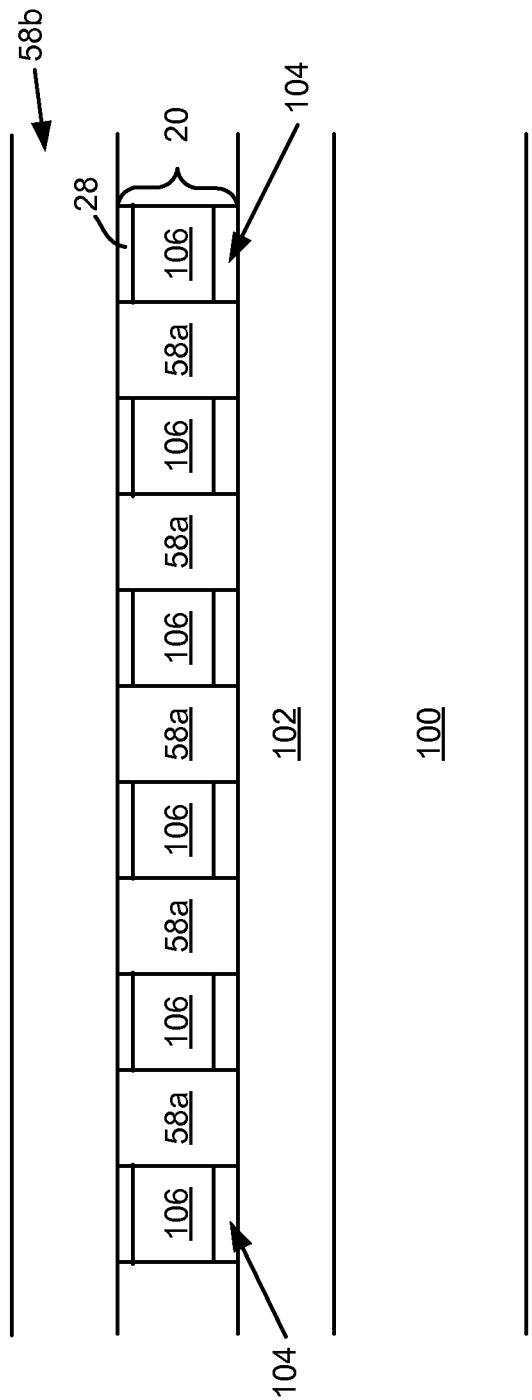

Formation of CNT layer 12 by damascene integration now begins. Referring to FIG. 3B, a dielectric layer 58b having a desired thickness is deposited over planar surface 110. The thickness of dielectric layer 58b may dictate the largest possible thickness for CNT layer 12 as described further below. In some embodiments, dielectric layer 58b may be between about 100-1500 angstroms, and in some embodiments between about 400-1000 angstroms, of silicon dioxide. Other dielectric materials such as silicon nitride, silicon oxynitride, low k dielectrics, etc., and/or other dielectric layer thicknesses may be used.

Figure 3C:
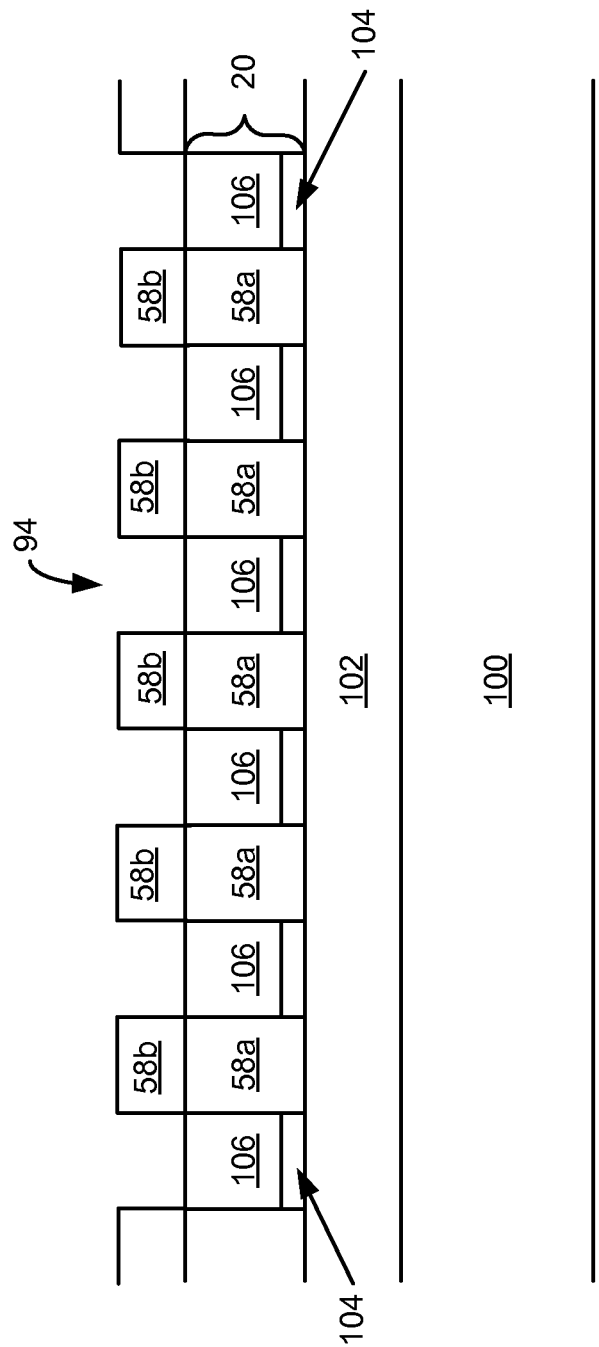

Referring to FIG. 3C, dielectric layer 58b is patterned and etched to form openings 94 that expose each first conductor 20 (e.g., barrier layer 28 if present). Some misalignment may be tolerated. Dielectric layer 58b may be patterned and etched using known techniques such as wet or dry etching with a hard or soft mask. Openings 94 may have any suitable shape. For simplicity, openings 94 are depicted as having a cylindrical shape. Other shapes may be used, such as rectangular, triangular, oval, trapezoidal, rhomboidal, irregular, or other similar shape.

In some embodiments, the width of openings 94 and/or thickness of dielectric layer 58b may be selected to promote drawing of a liquid CNT solution into openings 94 via capillary action. For example, a width range of about 10 nm to about 10 μm for openings 94 may facilitate drawing of liquid CNT solution into openings 94 via capillary action, depending on the particular CNT solution employed (e.g., viscosity, density, orientation (rafted), polarity, multi/single walls, etc.) In one particular embodiment, openings 94 may have a width of about 43 nanometers or less. Other widths may be used for openings 94.

Following formation of openings 94, CNT layer 12 is formed in each opening 94. In the exemplary embodiment, CNT material is deposited in a liquid solution using a spin-on technique. Other carbon based switching materials and/or deposition techniques may be used.

When CNT layer 12 is to be formed using a spin-on technique, the surface of substrate 100 may be pre-conditioned to accept the solution that contains the CNT material. For example, the surface may be baked and/or chemically altered. In some embodiments, substrate 100 may be annealed in nitrogen, hydrogen or another suitable gas at a temperature between about 120° C.-200° C. for between about 1-2 minutes. Other temperature/time ranges for pre-condition baking include about 50-500° C. for about 5 minutes or about 100-200° C. for about 1 minute. Other times and/or temperatures may be used. Such baking may reduce the moisture content of substrate 100.

Alternatively or additionally, a chemical may be introduced on the surface of the substrate to alter the surface tension of substrate 100 (e.g., to improve uniformity and/or the distribution properties of the CNT solution across the substrate). For example, hexamethyldisiloxane or a similar chemical may be introduced on the surface of substrate 100 in vapor form or as a liquid (using a spin-on technique). A second anneal then may be performed to further dry substrate 100. For example, substrate 100 may be annealed at a temperature between about 100° C.-200° C., more generally between about 50° C.-500° C., for between about 1-5 minutes. The wafer is then cooled before CNT material is deposited. For example, substrate 100 may be cooled to about 20-30° C. for up to about 2 minutes, or between about 21-23° C. for up to about 1 minute. Other cooling ("chill") times and/or temperatures may be used.

Following pre-conditioning, a solution that includes a CNT material mixed with a liquid, such as water, alcohol or another solvent is deposited on substrate 100 using a selected spin-on technique. An exemplary spin-on procedure is described below; however, other spin-on procedures may be used. The CNT material may include single wall tubes, double wall tubes, multi-wall tubes, shortened CNTs such as buckeyballs, combinations of the same or any other CNT form. The solution may include CNT material and also filler material such as amorphous carbon, other carbon materials, silica nanoparticles, or dielectric filler material in any suitable ratio.

Exemplary CNT formulations that may be used with this invention are described in Bertin et al. U.S. Patent Publication No. 2009/0184389, titled "Nonvolatile Nanotube Diodes And Nonvolatile Nanotube Blocks And Systems Using Same And Methods Of Making Same," Sen et al. U.S. Pat. No. 7,504, 051, titled "Applicator Liquid For Use In Electronic Manufacturing Processes," Ghenciu et al. U.S. Pat. No. 7,666,382, titled "Aqueous Carbon Nanotube Applicator Liquids And Methods For Producing Applicator Liquids Thereof," Sen et al. U.S. Patent Publication No. 2008/0179571, titled "Spin-Coatable Liquid For Formation Of High Purity Nanotube Films," and Sen et al. U.S. Patent Publication No. 2009/0140213, titled "Method Of Making An Applicator Liquid For Electronics Fabrication Process," each of which is incorporated by reference herein in its entirety.

An exemplary spin-on process for a CNT solution is provided below in Table 1. The spin-on process includes the following steps (1) pre-wet; (2) CNT solution dispense; (3) caste or removal of excess CNT solution; (4) CNT solution settle; (5) extend to edge bead region (EBR); (6) flick; (7) EBR rinse/cut; and (8) final dry. Other steps, speeds and/or durations may be used.

TABLE 1.0

EXEMPLARY CNT SPIN-ON PROCESS

| SPIN-ON STEP | SPEED (RPM) | DURATION (SECONDS) |
|---|---|---|
| PRE-WET | 2250-3750 | 2-4 |
| CNT DISPENSE | 35-60 | 7-12 |
| CASTE | 100-200 | 6-10 |
| CNT SETTLE | 35-60 | 110-190 |
| EXTEND TO EBR | 250-430 | 80-140 |
| FLICK | 375-625 | 7-12 |
| EBR RINSE/CUT | 460-780 | 33-55 |
| FINAL DRY | 2250-3750 | 7-12 |

In an exemplary embodiment, substrate 100 is rotated at a high speed and de-ionized water is dispensed on substrate 100 prior to dispensing of the CNT solution (pre-wet step). After pre-wet, substrate 100 is rotated at a speed appropriate for the CNT solution to be dispensed on the substrate (CNT dispense step). The speed may be selected to be sufficient to allow the CNT solution to extend across substrate 100 while allowing the CNT solution to be forced into openings 94 (e.g., by centrifugal and capillary action). Accordingly, the speed may depend on such factors as the dimensions of openings 94, the size of substrate 100, the properties of the CNT solution (e.g., density, viscosity, filler material, solvent, etc.) or the like.

In an exemplary embodiment, a photo-resist track may be modified for the CNT suspension and the spin recipe modified so that capillary forces pull the CNT suspension into openings 94 while few CNTs remain on the dielectric material between openings 94. Alternatively, the CNT suspension may be deposited using a track other than a resist track. In addition, to create a substantially defect-free CNT film, the CNT film should not be exposed to volatile solvents, such as acetone, isopropyl alcohol, or other similar volatile solvents.

Following CNT solution dispensing, substrate 100 is allowed to spin so that the CNT solution reaches the outer edge of substrate 100 and enters openings 94. The spin rate of substrate 100 then is increased to spin off most of the CNT solution that has not entered openings 94 (caste step). The spin rate is then reduced again to allow the CNT solution to settle and thicken in openings 94 (CNT settle step).

Thereafter, the spin rate is again increased to extend the coat of CNT solution to the edge bead region (EBR) of substrate 100 (extend to EBR step). The spin rate is again increased to caste any remaining CNT solution from the edge of substrate 100 (flick step). The spin rate is further increased and an EBR rinse and backside rinse are performed (EBR rinse/cut step). The spin rate is increased yet again to dry substrate 100 (final dry step).

After the spin procedure is completed, substrate 100 is annealed in hydrogen, nitrogen or another gas at a temperature between about 100° C.-500° C. for up to about 5 minutes, and in some embodiments, at a temperature between about 150° C.-350° C. for up to about 2 minutes. Other anneal environments, temperatures and/or times may be used. Annealing allows the CNT solution to dry, forming a solid layer of CNT material 12 in each opening 94, as shown in FIG. 3D.

Following annealing, substrate 100 is cooled by exposure to an environment at a temperature between about 20 to 30° C. for about 2 minutes, or between about 21-23° C. for about 1 minute. Other chill times and/or temperatures may be used.

In some embodiments, the deposition, bake and chill procedures described above may be repeated multiple times to achieve a desired thickness for CNT layer 12. In the exemplary embodiment, the thickness of CNT layer 12 may be between about 100 angstroms and about 600 angstroms, more generally between about 5 angstroms and about 1000 angstroms. In some embodiments, the deposition, bake and chill procedures may be repeated about 1-25 times to obtain a CNT layer within this thickness range. Other thickness ranges may be used.

In some embodiments, additional spin coating techniques may be employed to assist in CNT layer formation. For example, substrate 100 may be exposed to heat treatment (as described), agitation, ultrasonic vibration, combinations thereof or the like.

In some embodiments in accordance with this invention, following formation of CNT layer 12, an anneal step may be performed prior to depositing additional material. In particular, the anneal may be performed in a vacuum or the presence of one or more forming gases, at a temperature in the range from about 350° C. to about 900° C., for about 30 to about 180 minutes. The anneal preferably is performed in about an 80%($N_2$):20%($H_2$) mixture of forming gases, at about 625° C. for about one hour.

Suitable forming gases may include one or more of $N_2$, Ar, and $H_2$, whereas preferred forming gases may include a mixture having above about 75% $N_2$ or Ar and below about 25% $H_2$. Alternatively, a vacuum may be used. Suitable temperatures may range from about 350° C. to about 900° C., whereas preferred temperatures may range from about 585° C. to about 675° C. Suitable durations may range from about 0.5 hour to about 3 hours, whereas preferred durations may range from about 1 hour to about 1.5 hours. Suitable pressures may range from about 1 T to about 760 T, whereas preferred pressures may range from about 300 T to about 760 T.

A queue time of preferably about 2 hours between the anneal and the deposition of additional layers preferably accompanies the use of the anneal. A ramp up duration may range from about 0.2 hours to about 1.2 hours and preferably is between about 0.5 hours and 0.8 hours. Similarly, a ramp down duration also may range from about 0.2 hours to about 1.2 hours and preferably is between about 0.5 hours and 0.8 hours.

Although not wanting to be bound by any particular theory, it is believed that carbon-based materials may absorb water from the air over time. Likewise, it is believed that the moisture may increase the likelihood of de-lamination of carbon-based material. In some cases, it also might be acceptable to have a queue time of 2 hours from the time of deposition of a carbon-based material to deposition of additional layers, skipping the anneal altogether.

Incorporation of such a post-carbon-formation-anneal preferably takes into account other layers of the memory cell, because these other memory cell layers will also be subject to the anneal. For example, the anneal may be omitted or its parameters may be adjusted where the aforementioned preferred anneal parameters would damage the other memory cell layers. The anneal parameters may be adjusted within ranges that result in the removal of moisture without damaging the layers of the annealed memory cell. For instance, the temperature may be adjusted to stay within an overall thermal budget of a memory cell being formed. Likewise, any suitable forming gases, temperatures and/or durations may be used that are appropriate for a particular memory cell. In general, such an anneal may be used with any carbon-based layer or carbon-containing material, such as layers having CNT material, graphite, graphene, amorphous carbon, etc.

Figure 3E:
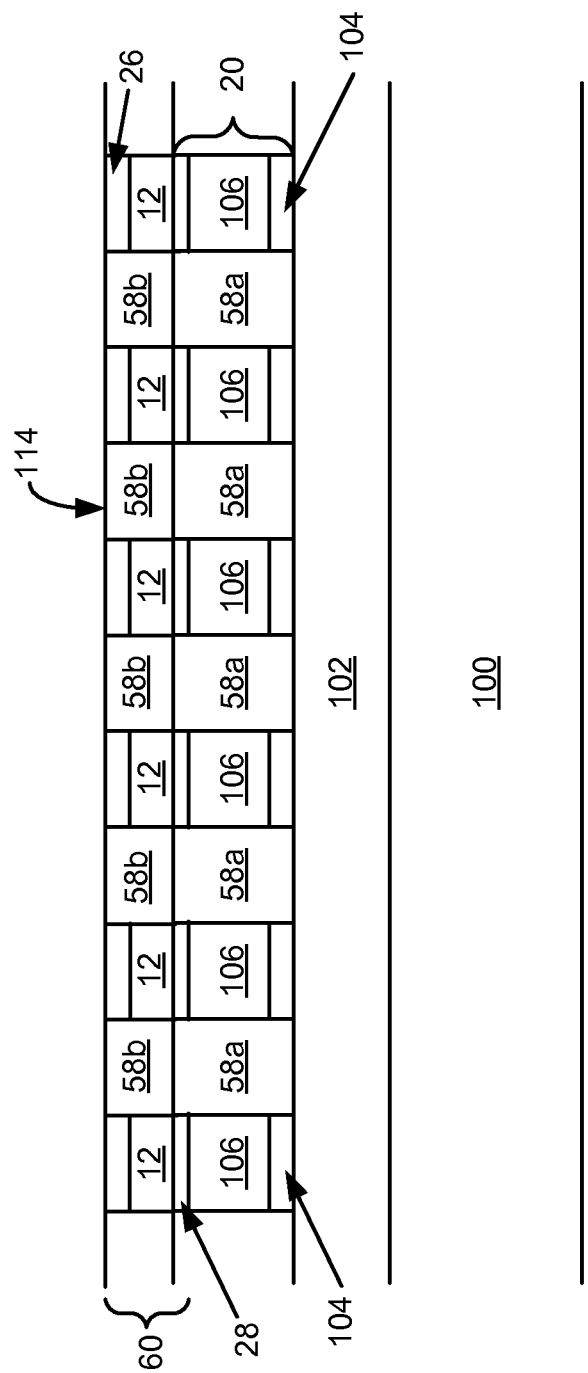

Referring to FIG. 3E, barrier layer 26 is formed over dielectric layer 58b and CNT material 12 in openings 94, and CMP or etchback is used to create a planar surface with dielectric layer 58b and barrier layer 26 coplanar and exposed (forming planar surface 114). In some embodiments, about 500 angstroms to about 1500 angstroms of barrier layer material is deposited over dielectric layer 58b and openings 94, resulting in a barrier layer 26 thickness of about 200 angstroms to about 1000 angstroms following planarization. Barrier layer 26 may be titanium nitride or another suitable barrier layer such as tantalum nitride, tungsten, tungsten nitride, molybdenum, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

In some embodiments, to prevent penetration of top electrode material into CNT layer 12, tungsten, tungsten nitride, molybdenum, cobalt, nickel or another metal or metal nitride may be formed over CNT layer 12 (as barrier layer 26). In some embodiments, a less energetic deposition technique such as an evaporative deposition technique may be used to form barrier layer 26.

As shown in FIG. 3E, barrier layer 26, CNT layer 12 and conductor 20 form an MIM stack 60 that may serve as a reversible resistance-switching element for each memory cell. Such an MIM stack may be coupled in series with a steering element such as a thin film transistor, diode, or other steering element to form a memory cell.

Next, deposition of the semiconductor material used to form the diode of each memory cell begins (e.g., diode 14 in FIGS. 1 and 2A). Each diode may be a vertical p-n or p-i-n diode as previously described. In some embodiments, each diode is formed from a polycrystalline semiconductor material such as polysilicon, a polycrystalline silicon-germanium alloy, polygermanium or any other suitable material. For convenience, formation of a polysilicon, downward-pointing diode is described herein. It will be understood that other materials and/or diode configurations may be used.

Figure 3F:
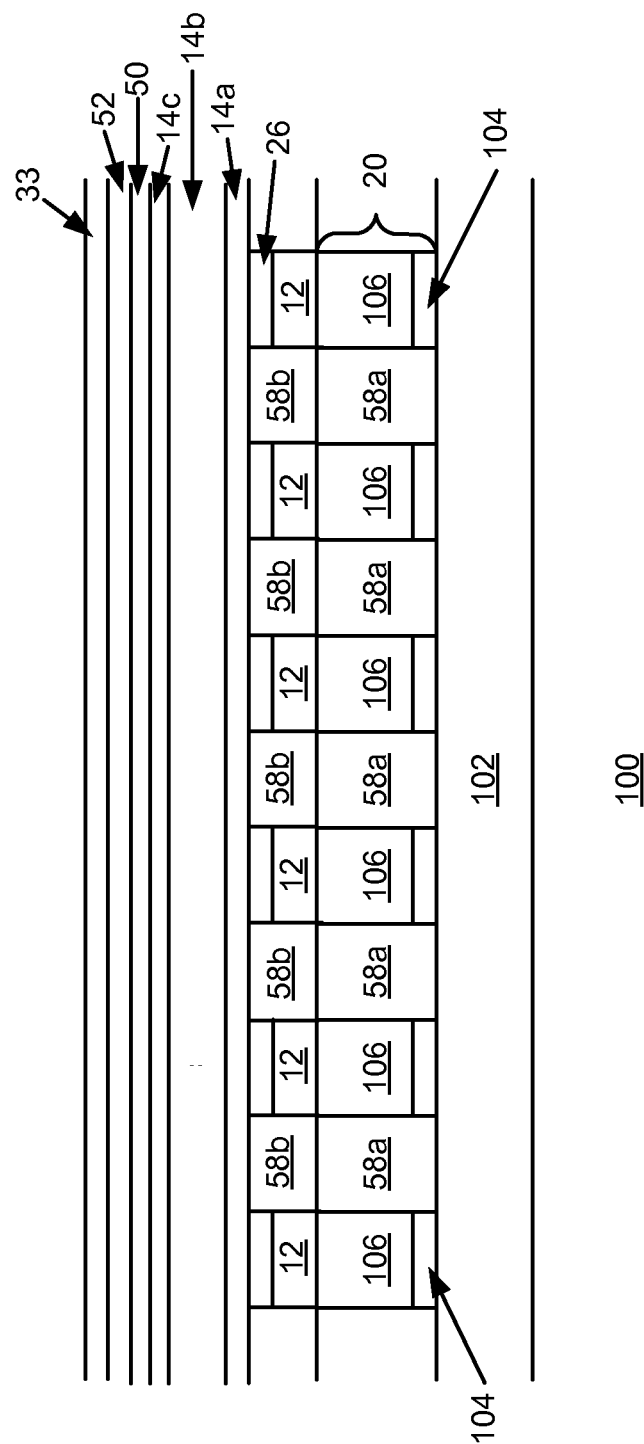

With reference to FIG. 3F, following formation of barrier layer 26, a heavily doped n+ silicon layer 14a is deposited above barrier layer 26. In some embodiments, n+ silicon layer 14a is in an amorphous state as deposited. In other embodiments, n+ silicon layer 14a is in a polycrystalline state as deposited. CVD or another suitable process may be employed to deposit n+ silicon layer 14a. In at least one embodiment, n+ silicon layer 14a may be formed, for example, from about 100 to about 1000 angstroms, preferably about 100 angstroms, of phosphorus or arsenic doped silicon having a doping concentration of about $10^{21}$ cm$^{-3}$. Other layer thicknesses, doping types and/or doping concentrations may be used. N+ silicon layer 14a may be doped in situ, for example, by flowing a donor gas during deposition. Other doping methods may be used (e.g., implantation).

After deposition of n+ silicon layer 14a, a lightly doped, intrinsic and/or unintentionally doped silicon layer 14b may be formed over n+ silicon layer 14a. In some embodiments, intrinsic silicon layer 14b may be in an amorphous state as deposited. In other embodiments, intrinsic silicon layer 14b may be in a polycrystalline state as deposited. CVD or another suitable deposition method may be employed to deposit intrinsic silicon layer 14b. In at least one embodiment, intrinsic silicon layer 14b may be about 500 to about 4800 angstroms, preferably about 2500 angstroms, in thickness. Other intrinsic layer thicknesses may be used.

A thin (e.g., a few hundred angstroms or less) germanium and/or silicon-germanium alloy layer (not shown) may be formed on n+ silicon layer 14a prior to depositing intrinsic silicon layer 14b to prevent and/or reduce dopant migration from n+ silicon layer 14a into intrinsic silicon layer 14b (as described in U.S. patent application Ser. No. 11/298,331, filed Dec. 9, 2005 and titled "Deposited Semiconductor Structure To Minimize N-Type Dopant Diffusion And Method Of Making" which is hereby incorporated by reference herein in its entirety for all purposes).

Heavily doped, p-type silicon may be either deposited and doped by ion implantation or may be doped in situ during deposition to form a p+ silicon layer 14c. For example, a blanket p+ implant may be employed to implant boron a predetermined depth within intrinsic silicon layer 14b. Exemplary implantable molecular ions include $BF_2$, $BF_3$, B and the like. In some embodiments, an implant dose of about 1-5× $10^{15}$ ions/cm$^2$ may be employed. Other implant species and/or doses may be used. Further, in some embodiments, a diffusion process may be employed. In at least one embodiment, the resultant p+ silicon layer 14c has a thickness of about 100-700 angstroms, although other p+ silicon layer sizes may be used.

Following formation of p+ silicon layer 14c, a silicide-forming metal layer 52 is deposited over p+ silicon layer 14c. Exemplary silicide-forming metals include sputter or otherwise deposited titanium or cobalt. In some embodiments, silicide-forming metal layer 52 has a thickness of about 10 to about 200 angstroms, preferably about 20 to about 50 angstroms and more preferably about 20 angstroms. Other silicide-forming metal layer materials and/or thicknesses may be used. A nitride layer (not shown) may be formed at the top of silicide-forming metal layer 52.

A rapid thermal anneal ("RTA") step may be performed to form silicide regions by reaction of silicide-forming metal layer 52 with p+ region 14c. In some embodiments, the RTA may be performed at about 540° C. for about 1 minute, and causes silicide-forming metal layer 52 and the deposited silicon of diode 14 to interact to form silicide layer 50, consuming all or a portion of silicide-forming metal layer 52. Following the RTA step, any residual nitride layer from silicide-forming metal layer 52 may be stripped using a wet chemistry. For example, if silicide-forming metal layer 52 includes a TiN top layer, a wet chemistry (e.g., ammonium, peroxide, water in a 1:1:1 ratio) may be used to strip any residual TiN.

Following the RTA step and the nitride strip step, barrier layer 33 is formed above silicide-forming metal layer 52. Barrier layer 33 may be about 5 to about 800 angstroms, and preferably about 100 angstroms, of titanium nitride or another suitable barrier layer such as tantalum nitride, tungsten nitride, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

Figure 3G:
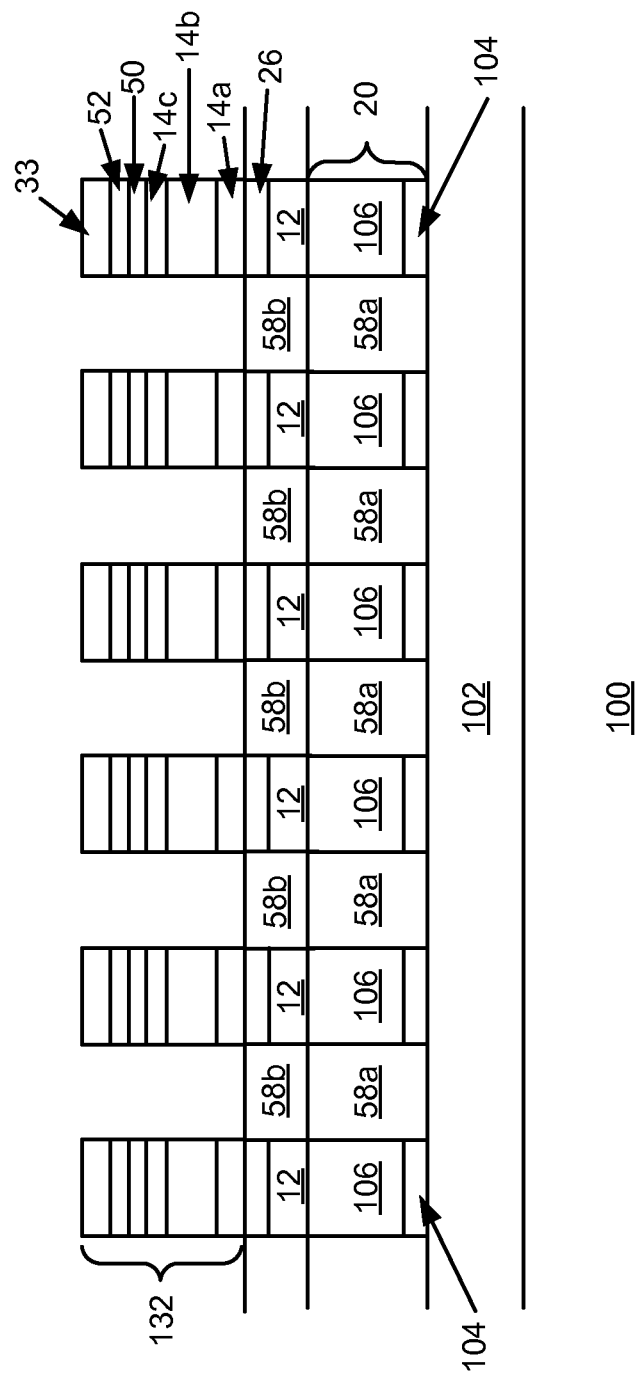
Figure 3H:
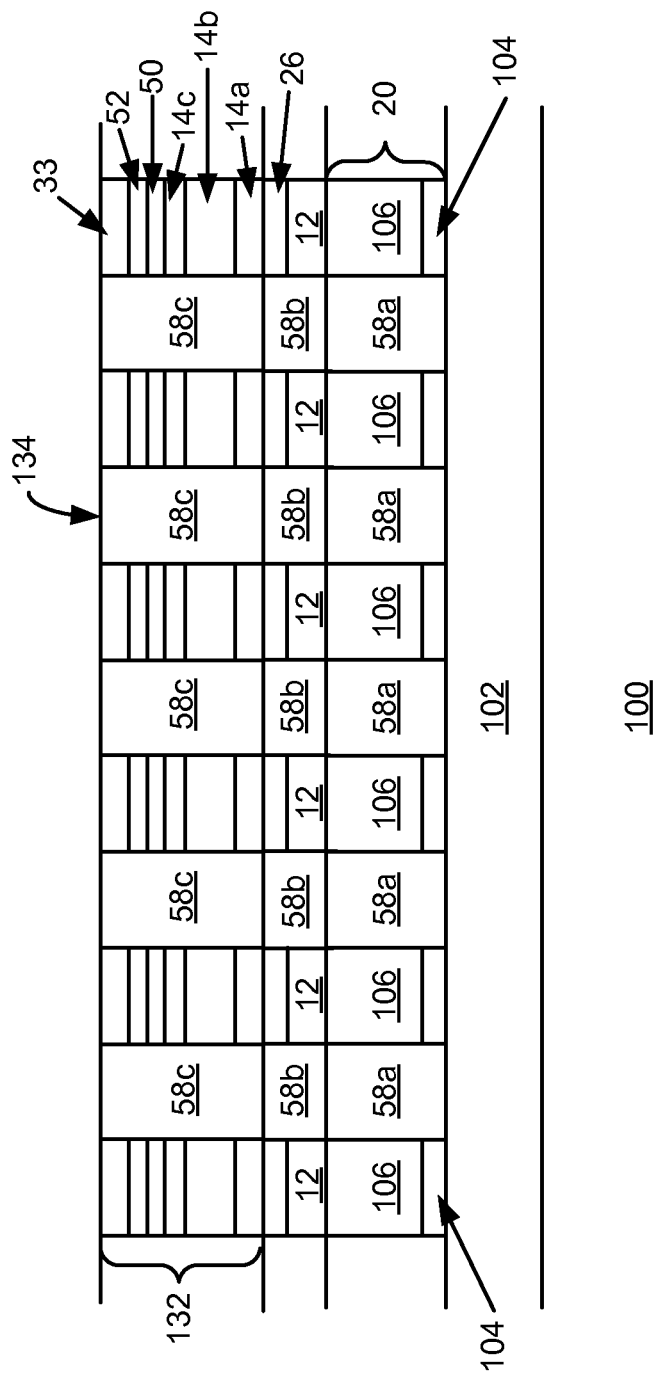

As shown in FIG. 3G, barrier layer 33, silicide-forming metal layer 52, silicide layer 50, and diode layers 14a-14c are patterned and etched to form pillars 132. Pillars 132 may have about the same pitch and about the same width as conductors 20 below, such that each pillar 132 is formed on top of a conductor 20. Some misalignment may be tolerated.

For example, photoresist may be deposited, patterned using standard photolithography techniques, layers 14a-14c, 50, 52, and 33 may be etched, and then the photoresist may be removed. Alternatively, a hard mask of some other material, for example silicon dioxide, may be formed on top of barrier layer 33, with bottom antireflective coating ("BARC") on top, then patterned and etched. Similarly, dielectric antireflective coating ("DARC") may be used as a hard mask.

Pillars 132 may be formed using any suitable masking and etching process. For example, layers 14a-14c, 50, 52, and 33 may be patterned with about 1 to about 1.5 micron, more preferably about 1.2 to about 1.4 micron, of photoresist ("PR") using standard photolithographic techniques. Thinner PR layers may be used with smaller critical dimensions and technology nodes. In some embodiments, an oxide hard mask may be used below the PR layer to improve pattern transfer and protect underlying layers during etching.

Any suitable etch chemistries, and any suitable etch parameters, flow rates, chamber pressures, power levels, process temperatures, and/or etch rates may be used. In some embodiments, barrier layer 33, silicide-forming metal layer 52, silicide layer 50, and diode layers 14a-14c may be patterned using a single etch step. In other embodiments, separate etch steps may be used. The etch proceeds down to dielectric layer 58b.

After etching pillars 132 may be cleaned using a dilute hydrofluoric/sulfuric acid clean. Such cleaning, whether or not PR asking is performed before etching, may be performed in any suitable cleaning tool, such as a Raider tool, available from Semitool of Kalispell, Mont.

After pillars 132 have been cleaned, a dielectric layer 58c may be deposited over pillars 132 to fill the voids between pillars 132. For example, approximately 200-7000 angstroms of silicon dioxide may be deposited and planarized using chemical mechanical polishing or an etchback process to remove excess dielectric material 58c and form a planar surface 134, resulting in the structure illustrated in FIG. 3H. Planar surface 134 includes exposed top surfaces of pillars 132 separated by dielectric material 58c (as shown). Other dielectric materials such as silicon nitride, silicon oxynitride, low k dielectrics, etc., and/or other dielectric layer thicknesses may be used.

Figure 3I:
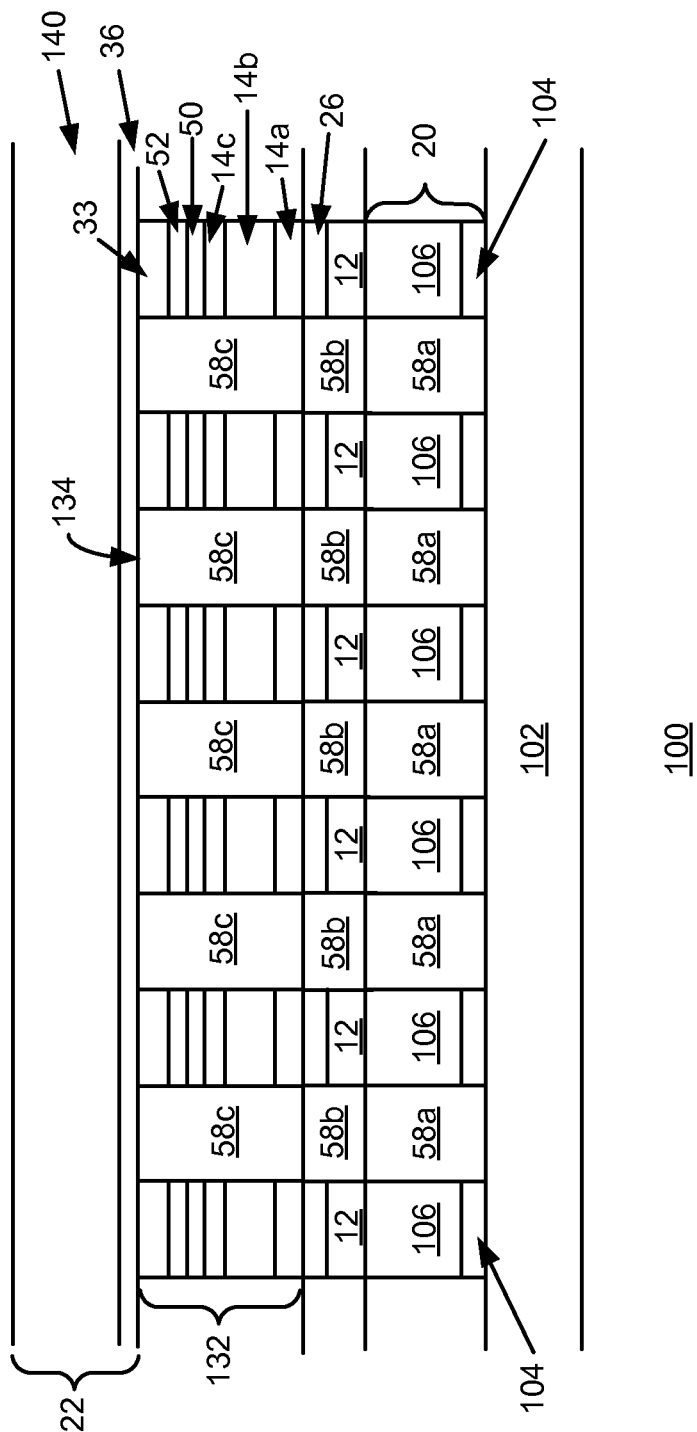

With reference to FIG. 3I, second conductors 22 may be formed above pillars 132 in a manner similar to the formation of first conductors 20. For example, in some embodiments, one or more barrier layers and/or adhesion layers 36 may be deposited over pillars 132 prior to deposition of a conductive layer 140 used to form second conductors 22.

Conductive layer 140 may be formed from any suitable conductive material such as tungsten, another suitable metal, heavily doped semiconductor material, a conductive silicide, a conductive silicide-germanide, a conductive germanide, or the like deposited by any suitable method (e.g., CVD, PVD, etc.). Other conductive layer materials may be used. Barrier layers and/or adhesion layers 36 may include titanium nitride or another suitable layer such as tantalum nitride, tungsten nitride, combinations of one or more layers, or any other suitable material(s). The deposited conductive layer 140 and barrier and/or adhesion layer 36 may be patterned and etched to form second conductors 22. In at least one embodiment, second conductors 22 are substantially parallel, substantially coplanar conductors that extend in a different direction than first conductors 20.

In other embodiments of the invention, second conductors 22 may be formed using a damascene process in which a dielectric layer is formed, patterned and etched to create openings or voids for conductors 22. The openings or voids may be filled with adhesion layer 36 and conductive layer 140 (and/or a conductive seed, conductive fill and/or barrier layer if needed). Adhesion layer 36 and conductive layer 140 then may be planarized to form a planar surface.

Following formation of second conductors 22, the resultant structure may be annealed to crystallize the deposited semiconductor material of diodes 14 (and/or to form silicide regions by reaction of the silicide-forming metal layer 52 with p+ region 14c). The lattice spacing of titanium silicide and cobalt silicide are close to that of silicon, and it appears that silicide layers 50 may serve as "crystallization templates" or "seeds" for adjacent deposited silicon as the deposited silicon crystallizes (e.g., silicide layer 50 enhances the crystalline structure of silicon diode 14 during annealing at temperatures of about 600-800° C.). Lower resistivity diode material thereby is provided. Similar results may be achieved for silicon-germanium alloy and/or germanium diodes.

Thus in at least one embodiment, a crystallization anneal may be performed for about 10 seconds to about 2 minutes in nitrogen at a temperature of about 600 to 800° C., and more preferably between about 650 and 750° C. Other annealing times, temperatures and/or environments may be used.

The foregoing description discloses only exemplary embodiments of the invention. Modifications of the above disclosed apparatus and methods which fall within the scope of the invention will be readily apparent to those of ordinary skill in the art. For instance, in any of the above embodiments, the CNT material may be located above the diodes 14. Further, persons of ordinary skill in the art will understand that memory cells 10 in accordance with this invention alternatively may include MIM stacks coupled between first and second conductors 20 and 22, respectively, for use with remotely fabricated steering elements.

As stated, although the invention has been described primarily with reference to CNT films, other carbon-based switching materials may be similarly used. Further, in some embodiments, each carbon-based switching layer is formed between two conducting layers such as titanium nitride or other barrier/adhesion layers to form an MIM stack in series with a steering element. Persons of ordinary skill in the art will understand that alternative memory cells in accordance with this invention may be fabricated with other similar techniques.

Accordingly, although the present invention has been disclosed in connection with exemplary embodiments thereof, it should be understood that other embodiments may fall within the spirit and scope of the invention, as defined by the following claims.

The invention claimed is:

1. A method of forming a memory cell, the method comprising the following steps performed in order:
   (a) forming a layer of dielectric material above a substrate;
   (b) forming an opening in the dielectric layer;
   (c) forming a carbon-based switching material layer within the opening by:
      (i) depositing a solution that includes a carbon-based switching material on the substrate;
      (ii) rotating the substrate to cause the solution to flow into the opening;
      (iii) annealing the substrate at a temperature between 100° C. and 500° C. for up to five minutes;
      (iv) after step (iii), cooling the substrate to a temperature between 20° C. to 30° C.; and
      (v) repeatedly performing steps (i) through (iv) until a desired thickness of carbon-based switching material remains in the opening; and
   (d) forming a memory element using the carbon-based switching material layer.

2. The method of claim 1, wherein the dielectric layer comprises silicon dioxide.

3. The method of claim 1, wherein the opening has a width of 43 nanometers or less.

4. The method of claim 1, wherein forming the opening comprises exposing a conductive layer located below the dielectric material.

5. The method of claim 1, further comprising forming a plurality of openings in the dielectric layer, and rotating the substrate to cause the solution to flow into each opening and to form a carbon-based switching material layer within each opening.

6. The method of claim 1, wherein the solution comprises a carbon-based switching material and water.

7. The method of claim 1, wherein the carbon-based switching material comprises CNT material.

8. The method of claim 1, wherein annealing the substrate causes the carbon-based switching material to remain in the opening.

9. The method of claim 1, wherein the carbon-based switching material layer has a thickness of 100 to 600 angstroms.

10. The method of claim 1, further comprising forming a conducting layer within the opening and above the carbon-based switching material layer.

11. A memory cell formed by the method of claim 1.

12. A method of forming a memory cell, the method comprising the following steps performed in order:
   (a) forming a layer of dielectric material above a substrate;
   (b) forming an opening in the dielectric layer;
   (c) depositing a solution that includes a carbon-based switching material on the substrate;
   (d) rotating the substrate to cause the solution to flow into the opening and to form a carbon-based switching material layer within the opening;
   (e) annealing the substrate after step (d) at a temperature between 100° C. and 500° C. for up to five minutes so that the carbon-based switching material remains in the opening;
   (f) after step (e), cooling the substrate to a temperature between 20° C. to 30° C.;
   (g) repeating steps (c)-(f) until the carbon-based switching material layer within the opening has a desired thickness; and
   (h) forming a memory element using the carbon-based switching material layer.

13. The method of claim 12, further comprising forming a plurality of openings in the dielectric layer, and rotating the substrate to cause the solution to flow into each opening and to form a carbon-based switching material layer within each opening.

14. The method of claim 12, wherein the carbon-based switching material layer has a thickness of 100 to 600 angstroms.

15. A memory cell formed by the method of claim 12.

* * * * *